US011183522B2

(12) United States Patent
Sennhenn (10) Patent No.: US 11,183,522 B2
(45) Date of Patent: Nov. 23, 2021

(54) PIXEL ARRAY FOR A CAMERA, CAMERA AND LIGHT PROPAGATION TIME CAMERA SYSTEM HAVING A CAMERA OF THIS KIND

(71) Applicant: PMDTECHNOLOGIES AG, Siegen (DE)

(72) Inventor: Florian Sennhenn, Dresden (DE)

(73) Assignee: PMDTECHNOLOGIES AG, Siegen (DE)

( * ) Notice: Subject to any disclaimer, the term of this patent is extended or adjusted under 35 U.S.C. 154(b) by 0 days.

(21) Appl. No.: 16/966,692

(22) PCT Filed: Jan. 24, 2019

(86) PCT No.: PCT/EP2019/051776
§ 371 (c)(1),
(2) Date: Jul. 31, 2020

(87) PCT Pub. No.: WO2019/149619
PCT Pub. Date: Aug. 8, 2019

(65) Prior Publication Data
US 2021/0036038 A1 Feb. 4, 2021

(30) Foreign Application Priority Data
Feb. 5, 2018 (DE) .................. 10 2018 102 458.4

(51) Int. Cl.
*H01L 27/14* (2006.01)
*H01L 27/146* (2006.01)
(Continued)

(52) U.S. Cl.
CPC .. *H01L 27/14605* (2013.01); *H01L 27/14607* (2013.01); *H01L 27/14636* (2013.01); *H04N 5/3454* (2013.01); *H04N 5/37457* (2013.01)

(58) Field of Classification Search
CPC ......... H01L 27/14605; H01L 27/14607; H01L 27/14636; H04N 5/3454; H04N 5/37457
See application file for complete search history.

(56) References Cited

U.S. PATENT DOCUMENTS

| 6,777,659 | B1 | 8/2004 | Schwarte |
| 8,294,882 | B2 * | 10/2012 | Van Der Tempel ........................ H01L 31/0352 356/5.01 |

(Continued)

FOREIGN PATENT DOCUMENTS

| DE | 19821974 A1 | 11/1999 |
| DE | 19704496 C2 | 2/2001 |

(Continued)

*Primary Examiner* — Kevin K Pyo
(74) *Attorney, Agent, or Firm* — Harness, Dickey & Pierce, P.L.C.

(57) ABSTRACT

The disclosure relates to a pixel array for a camera, in particular for a light propagation time camera, having: a plurality of pixel elements arranged in a matrix arrangement, wherein each individual pixel element has a photoelectric region and at least one other region which is non-sensitive to light; and a plurality of routing paths which are arranged in a grid-like manner and which divide the pixel array into fields. A group of first fields and a group of second fields are created, in which each of the first fields is provided by a photoelectric region of one of the pixel elements and each of the second fields is provided by the other regions, wherein the first fields and the second fields are arranged in an alternating manner similar to a chessboard. The disclosure further relates to a corresponding camera, in particular a light propagation time camera for a light propagation time camera system, and to a corresponding light propagation time camera system.

9 Claims, 7 Drawing Sheets

(51) Int. Cl.
*H04N 5/345* (2011.01)
*H04N 5/3745* (2011.01)

(56) References Cited

U.S. PATENT DOCUMENTS

| | | | |
|---|---|---|---|
| 9,664,790 B2 * | 5/2017 | Wilks | G01S 7/4915 |
| 2007/0040100 A1 | 2/2007 | Zarnowski et al. | |
| 2019/0339392 A1 * | 11/2019 | Manabe | H04N 5/353 |

FOREIGN PATENT DOCUMENTS

| | | |
|---|---|---|
| DE | 102013208804 A1 | 12/2013 |
| DE | 102019101752 A1 | 8/2019 |
| EP | 2190185 B1 | 11/2013 |

\* cited by examiner

Fig. 9 ial Application
PIXEL ARRAY FOR A CAMERA, CAMERA AND LIGHT PROPAGATION TIME CAMERA SYSTEM HAVING A CAMERA OF THIS KIND

CROSS-REFERENCE TO RELATED APPLICATIONS

This application is a U.S. National Phase Application under 35 U.S.C. 371 of International Application No. PCT/EP2019/051776, filed on Jan. 24, 2019, which claims the benefit of German Patent Application No. 10 2018 102 458.4, filed on Feb. 5, 2018. The entire disclosures of the above applications are incorporated herein by reference.

FIELD

The disclosure relates to a pixel array for a camera, in particular for a light propagation time camera, comprising (i) a plurality of pixel elements arranged in a matrix arrangement, wherein each individual pixel element has a photoelectric region and at least one non-photosensitive other region and (ii) a plurality of routing paths which are arranged in a grid-like manner and divide the pixel array into fields.

The disclosure further relates to a corresponding camera, in particular a light propagation time camera for a light propagation time camera system and a corresponding light propagation time camera system.

BACKGROUND

This section provides background information related to the present disclosure which is not necessarily prior art.

A pixel array of the type mentioned above for a video camera, is known, for example, from EP 2190185 B1. The individual pixel elements are divided into a photoelectric conversion region and at least one other region for the circuit electronics. In addition to these regions there are also wiring regions of a wiring extending in a longitudinal and transverse direction for signal routing. Wiring areas may overlap parts of the circuit electronics or the photoelectric conversion regions.

A light propagation time camera system comprising a light propagation time camera is known, for example, from the patent DE 19704496 C2. The light propagation time camera of this camera system is based on the photomixing element principle. The patent document also shows a section through a photonic mixing element of a pixel element of the light propagation time camera as well as parts of a readout device designated there as an interline transfer readout device for reading out the pixels.

SUMMARY

This section provides a general summary of the disclosure, and is not a comprehensive disclosure of its full scope or all of its features.

It is the object of the disclosure is to provide measures that improve the functionality of a pixel array of a camera, in particular increase the efficiency of this pixel array and/or reduce interference.

The object is achieved by the features of the independent claims.

In the pixel array according to the disclosure, it is provided that a group of first fields and a group of second fields result, in which each of the first fields is provided by a photoelectric region of one of the pixel elements and each of the second fields is provided by the other regions of the pixel elements, wherein the first fields and the second fields are arranged alternately in a chessboard structure. In this way, only half of the fields in total, namely only the first fields, have a photoelectric region of a pixel element. These are arranged in rows and columns, wherein this arrangement extends diagonally to the orientation of the routing paths.

As a result of this measure, a smallest pixel spacing, referred to as a pixel pitch, results diagonally to the orientations of the routing paths arranged in a grid-like manner. This geometry results in a reduction of crosstalk during reading out the individual pixels.

According to a preferred embodiment of the disclosure, means for reading out the pixel elements are arranged in at least part of the other regions. These means are in particular readout electronics components.

In general, the size ratios between the photoelectric region on the one hand and the at least one other region on the other hand can be freely selected. In particular, however, it is provided that, in each pixel element the area of the photoelectric region corresponds approximately to the area of the other region or the total area of the other regions. Advantageously, the pixel element comprises only one or two other regions.

According to a further preferred embodiment of the disclosure each of the second fields is provided by at least one other region of a single one of the pixel elements, the photoelectric region of which is arranged in an adjacent first field. Preferably, each of the second fields is provided by exactly one other region of a single one of the pixel elements the photoelectric region of which is disposed in an adjacent first field.

Alternatively, it is preferably provided that each of the second fields, which is completely surrounded by further fields, is provided by at least two other regions of two pixel elements the photoelectric regions of which provide an adjacent first field. Such a second field which is completely surrounded by further fields is not a field at the edge of the pixel array. Preferably, each of the second fields, which is completely surrounded by further fields, is provided by exactly two other regions of two pixel elements the photoelectric regions of which provide an adjacent first field.

Advantageously, it is provided that the fields are configured square, i.e. have a contour in the form of a square.

According to a preferred embodiment of the disclosure, the photoelectric region of each pixel element is divided into two subregions, wherein each subregion is adjacent to one of the two opposing other regions of the pixel element.

According to a further preferred embodiment of the disclosure, the photoelectric region comprises a photonic mixing element. The corresponding camera is usually a light propagation time camera whose imaging sensor is based on the photomixing element principle. In this case, the corresponding imaging light propagation time sensor is configured as a photonic mixing element sensor with modulation channels. This sensor type is also referred to as PMD sensor (PMD: Photonic Mixer Device). Preferably, the corresponding photonic mixing element then can in particular be divided in two channels (channel A, channel B) comprising one photogate and one readout diode per channel. The channels A, B then correspond to the aforementioned two subregions of the photoelectric region.

The camera according to the disclosure, in particular a light propagation time camera for a light propagation time camera system, comprises a light propagation time sensor with an aforementioned pixel array.

In the light propagation time camera system comprising an illumination module for emitting modulated light and a light propagation time camera for receiving modulated light, it is provided that the light propagation time camera is configured as the aforementioned light propagation time camera.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

The disclosure will be explained in more detail by means of exemplary embodiments with reference to the drawings. In the drawings.

Corresponding reference numerals indicate corresponding parts throughout the several views of the drawings.

DETAILED DESCRIPTION

Example embodiments will now be described more fully with reference to the accompanying drawings.

Figure 1:
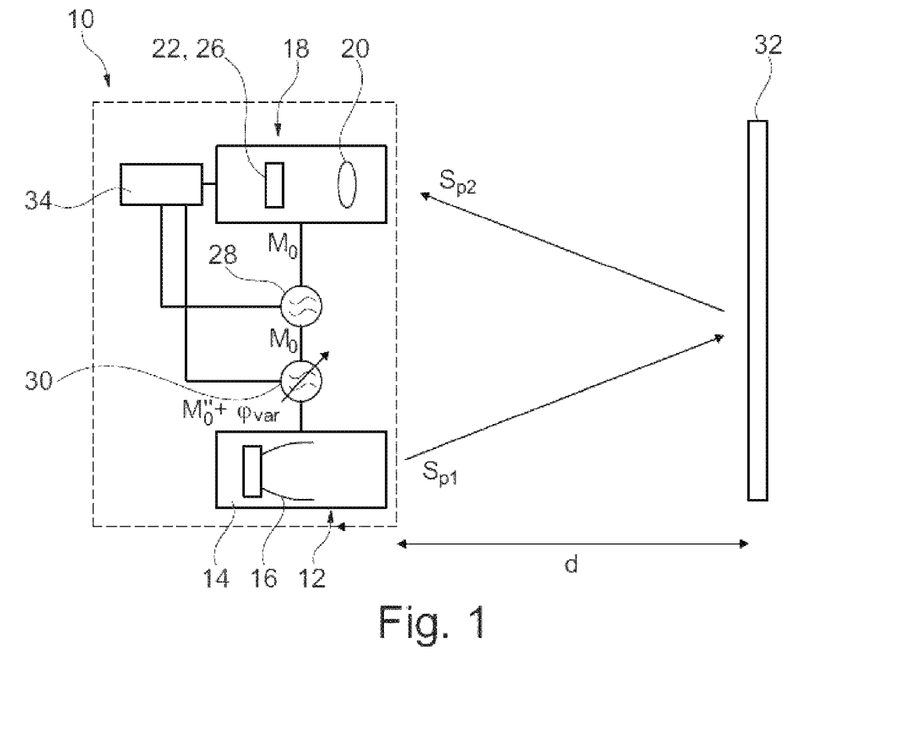
FIG. 1 is a schematic representation of a light propagation time camera system including a light propagation time camera.
Figure 3:
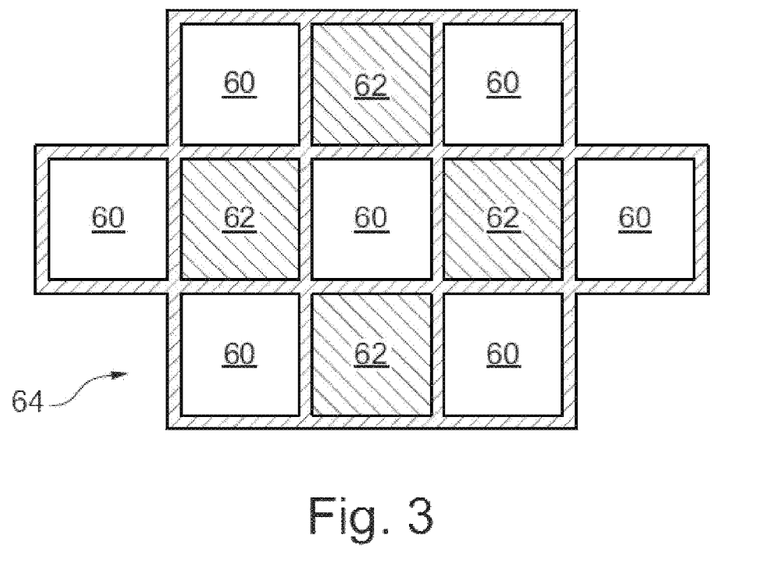
FIG. 3 is a part of a pixel array according to a first embodiment of the disclosure with the pixel elements (top) shown in FIG. 2 and an illustration of the resulting chessboard field arrangement (bottom)
Figure 5:
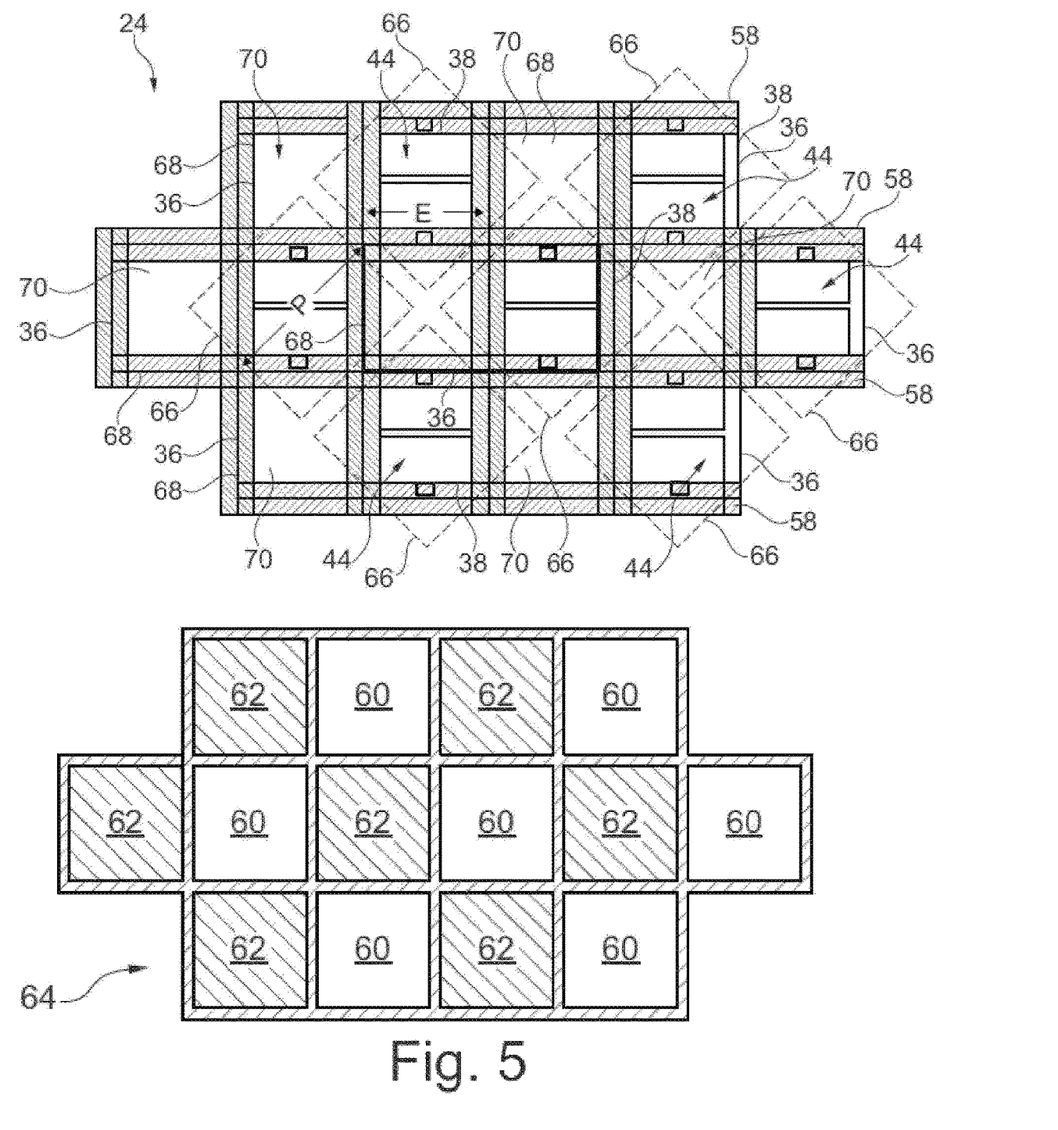
FIG. 5 is a part of a pixel array according to a second embodiment of the disclosure with the pixel elements (top) shown in FIG. 4 and an illustration of the resulting chessboard field arrangement (bottom)

FIG. 1 shows a schematic representation of a light propagation time camera system 10. The light propagation time camera system 10 comprises an emitting unit or an illumination module 12 with an illumination 14 and an associated beam shaping optics 16 as well as a receiving unit or light propagation time camera 18 with a receiving optics 20 and a light propagation time sensor 22. The light propagation time sensor 22 comprises a pixel array 24 (wherein possible embodiments of this array 24 are shown in FIGS. 3 and 5) and is formed in the example as a photonic mixing element sensor 26, also called PMD sensor. The receiving optics 20 typically consists of multiple optical elements in order to improve the imaging characteristics. The beam shaping optics 16 of the illumination module 12, for example, can be formed as a reflector or lens optics. In a very simple embodiment, optionally, optical elements can be dispensed with both at the reception and the emission side.

The measurement principle of this arrangement is essentially based on the fact that, based on the phase shift of the emitted and received light, the propagation time and thus the distance traveled by the received light can be determined. For this purpose, the illumination 14 and the light propagation time sensor 22 are applied with a modulation signal $M_0$ by a modulator 28.

In the example shown, moreover, between the modulator 28 and the illumination 14 a phase shifter 30 is provided by means of which the base phase $\varphi_0$ of the modulation signal $M_0$ of the light source 12 can be shifted around defined phase positions $\varphi_{var}$. For typical phase measurements, preferably phase positions of ($\varphi_{var}$=0°, 90°, 180°, 270° are used.

According to the set modulation signal 12 the light source emits an intensity modulated signal $Sp_1$ with the first phase position $p_1$ or $p_1=\varphi_0+\varphi_{var}$. This signal $Sp_1$ or the electromagnetic radiation is reflected in the illustrated case by an object 32 and hits with a corresponding phase shift $\Delta\varphi(t_L)$ as a received signal $Sp_2$ onto the light propagation time sensor 22 with a second phase position $p_2=\varphi_0+\varphi_{var}+\Delta\varphi(t_L)$ due to the distance traveled. In the light propagation time sensor 22 the modulation signal $M_0$ is mixed with the received signal $Sp_2$, wherein from the resulting signal the phase shift or the object distance d is determined.

Further, a modulation control device 34 is provided by means of which the shape, frequency and in particular pulse and pause ratios of the modulation signal are specified. Moreover, via the modulation control device 34 the phase shifter 30 can be controlled depending on the measurement task to be performed.

As an illumination or light source 12 preferably, infrared light emitting diodes and laser diodes are suitable. Of course, other radiation sources in other frequency ranges are conceivable, in particular, light sources in the visible frequency range come into consideration.

Figure 2:
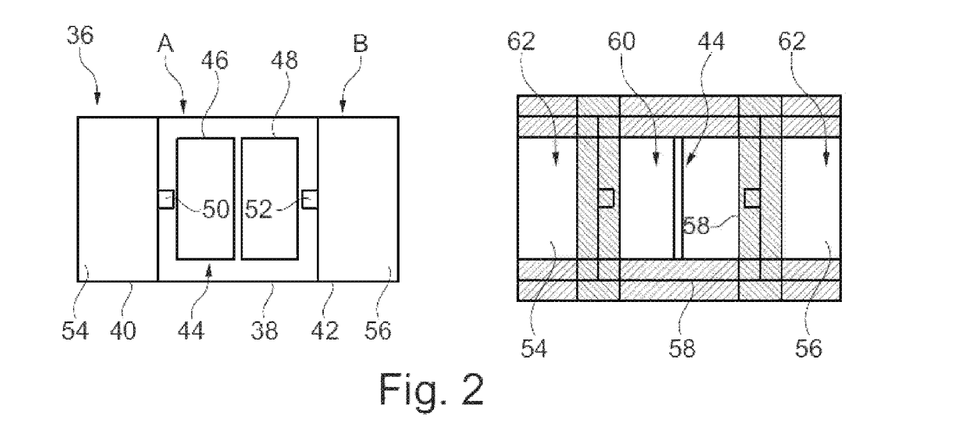
FIG. 2 is a pixel element according to a first embodiment for a pixel array of the light propagation time camera without (left) and with (right) corresponding routing paths.

FIG. 2 shows a pixel element 36 on the left for a pixel array 24 shown in FIG. 3 of a light propagation time sensor 22, which is part of a light propagation time camera 18 and operates according to the principle of the photonic mixing element sensor. The pixel element 36 comprises a central photoelectric region 38 and two light-insensitive other regions 40, 42 which sandwich the photoelectric region 38 on opposite sides. The central photoelectric area 38 accommodates for such light propagation time cameras 18 a photonic mixing element 44 (also referred to as optical mixer), which can be divided in two channels A, B each comprising a photogate 46, 48 as well as a readout diode 50, 52. In each of the other two other regions 40, 42 the respective readout electronics 54, 56 of one of the channels A, B is disposed. While the two photogates 46, 48 are disposed side by side in a central area of the photoelectric region 38, the two readout diodes 46, 48 are disposed at the sides opposite to each other in the periphery of the photoelectric region 38 respectively between the corresponding photogate 46, 48 and the corresponding other region 40, 42. Divided into the two channels A, B the photogate 46, the readout diode 50 as well as the readout electronics 54 in the other region 40 belong to channel A, while the photogate 48, the readout diode 52 as well as the readout electronics 56 in the other region 42 belong to channel B. The pixel element 36 is as a whole rectangular, wherein the length to width ratio is 2:1 and the central photoelectric region 38 occupies the full width and half the length of the pixel element 36 and thus has a square contour.

In the right area of FIG. 2 the same pixel element 36 but with the corresponding part of the routing of the pixel array 24 that is with longitudinally and transversely extending routing paths 58 for reading out the pixels is shown. The routing paths 58 are arranged in a grid-like manner, so that fields 60,62 encompassed by routing paths 58 arise. A first of these fields 60 is provided solely by the photoelectric region 38 while adjacent second one of these fields 62 are provided by the other regions 40, 42.

FIG. 3 shows a part of a pixel array 24 with the pixel elements 36 and the routing (top) shown in FIG. 2 and an illustration of the resulting chessboard structure 64 (bottom). In the comparison shown here, the first fields 60 with the photoelectric regions 38 correspond to the white fields of the chessboard structure 64 and the second fields 62 with the readout electronics 54 for channel A and the readout electronics 56 for channel B correspond to the black fields of the chessboard structure 64. In order to make the illustration clear, the first and second fields 60, 62 are designated in the chessboard structure 64 and not in the pixel array 24 itself.

As a result, a smallest pixel spacing designated as pixel pitch P diagonal to the orientations of the grid-like arranged routing paths 58 is obtained. This pixel pitch P results as the distance of the center of the photoelectric region 38 of a pixel element 36 to the center of the photoelectric region 38 of an immediately adjacent pixel element 36 of the pixel array. Due to the diagonal arrangement the pixel pitch P is greater by the factor $\sqrt{2}$ than the distance e (Pitch of the unit cell) of adjacent routing paths 58 which extend parallel to each other.

To this end the pixel elements 36 are arranged directly next to each other in each row. The rows are arranged offset from one another by the width of the photoelectric region 38 or the photonic mixing element 44. This results in the chessboard structure 64 in which the photonic mixing element 44 and the readout electronics 54, 56 are always arranged diagonally. The pixel pitch P also results from the square root of the area of the individual pixel element 36

$$\text{Pixel pitch} = \sqrt{A_{Evaluationelectronics} + A_{Opticalmixer}} = \sqrt{2 \cdot A_{UnitCell}}$$

The fill factor FF is maximum 50% if the routing does not occupy any area. Otherwise, the following fill factor results:

$$FF = 0.5 \cdot \frac{(2 \cdot A_{Unit\ cell} - A_{Routing})}{2 \cdot A_{Unit\ cell}}.$$

The sensor 22 further comprises micro lenses 66, which are placed centric over the photonic mixing element 44 and focus the incident light onto the square optical active surface of the respective photoelectric region 38. For a high efficiency of the micro lenses, a square shape is advantageous. This is ensured in the explained geometry of the pixel array by an arrangement of the micro lenses rotated by 45°.

In the pixel array 24 of FIG. 3 each of the second fields 62 which is not a field at the edge of the array 24 (i.e. which is completely surrounded by other fields 60, 62) is provided by two other regions 40, 42 of two pixel elements 36, the photoelectric regions 38 of which provide an adjacent first field 60.

The pixel element 36 of FIG. 4 and the pixel array of FIG. 5 correspond in many regions to the pixel element 36 in FIG. 2 and the pixel array of FIG. 3, so that only the differences will be discussed below.

Figure 4:
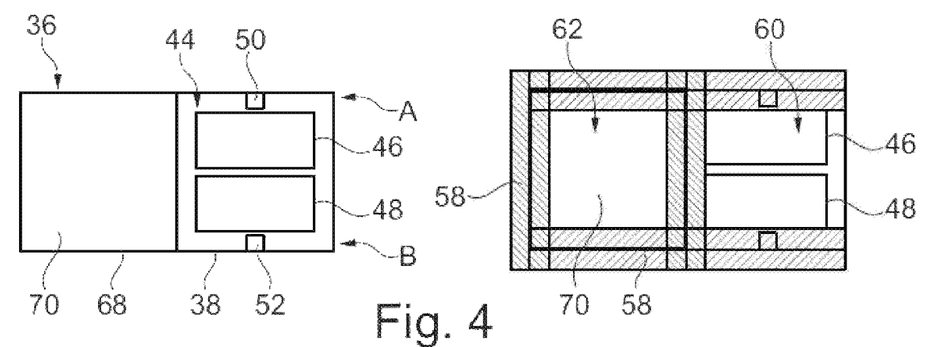
FIG. 4 is a pixel element according to a second embodiment for a pixel array of a light propagation time camera without (right) and with (left) corresponding routing paths.

FIG. 4 shows a pixel element 36 on the left for a pixel array 24 shown in FIG. 5 of a light propagation time sensor 22 which is part of a light propagation time camera 1 and operates according to the principle of the photonic mixing element sensor 8. The pixel element 36 comprises a photoelectric region 38 and a light-insensitive other region 68, wherein the two regions 38, 68 are each the same size, each having a square shape and are arranged side by side. Here, too, the photoelectric region 38 includes a photonic mixing element 44 which can be divided in two channels A, B each with a photogate 46, 48 as well as a readout diode 50, 52. In the other region 68 there is a readout electronics 70 for both channels, i.e. for channels A and B. While the two photogates 46, 48 are disposed side by side in a central area of the photoelectric region 38, the two readout diodes 46, 48 are disposed at the opposite sides in the periphery of the photoelectric region 38. Transverse to the orientation of this arrangement of the readout diodes 46, 48 the other region 68 with the readout electronics for channel A and B is arranged next to the photoelectric region 38. The pixel element 36 shown in FIG. 4, too, is as a whole rectangular, wherein the ratio length to width is 2:1 and each of the regions 38, 68, i.e. the photoelectric region 38 and other region 68, occupy the full width and half the length of the pixel element 36.

FIG. 5 shows a part of a pixel array 24 with pixel elements 36 shown in FIG. 4 and the routing (top) and an illustration of the resulting chessboard structure 64 (bottom). In the comparison shown here in FIG. 5, too, the first fields 60 with the photoelectric regions 38 correspond to the white fields of the chessboard structure 64 and the second fields 62 with the readout electronics 70 for channel A and B correspond to the black fields of the chessboard structure 64.

Again, this results in a smallest pixel spacing designated as pixel pitch P diagonal to the orientations of the routing paths 58 arranged in a grid-like manner. The pixel pitch P results as the distance of the center of the photoelectric region 38 of a pixel element 36 to the center of the photoelectric region 38 of an immediately adjacent pixel element 36 of the pixel array 24. Due to the diagonal arrangement the pixel pitch P is greater by the factor $\sqrt{2}$ than the distance E of adjacent routing paths 58 extending parallel to each other.

In this pixel array 24 each of the second fields 62 is provided by another region 68 of a single one of the pixel elements 36, the photoelectric region 38 of which is arranged in an adjacent first field 60.

The two embodiments of the pixel array 24 shown in FIGS. 3 and 5 show a particularly preferred geometry, which requires that the ratio length to width in the rectangular pixel element 36 is about 2:1, wherein in each pixel element 36 the area of the photoelectric region 38 corresponds approximately to the total area of the at least one other region 40, 42; 68. This allows, that the micro lenses 66 can be disposed centrically rotated by 45° above the photoelectric regions 38. The micro lenses 66 have a high gain with a square shape.

This results in the following advantages of the layout of the pixel array according to the disclosure 24 with a chessboard structure, in particular the layout shown in the examples:

1. Low crosstalk of the pixels;
2. High fill factor with small pixels (if $A_{Readout\ electronics} = A_{Opt.\ mixer}$) due to the effective arrangement of the readout electronics 54, 56, 70, routing 58 and photonic mixing element 44;

3. The square shape of the photoelectric region 38 with the photonic mixing element 44;
a.) allows a particularly effective use of the micro lenses 66 and
b.) is favorable for the contrast (keyword p-well constriction);
4. The routing:
a.) ensures a low coupling to the readout circuit, since the routing is not directly disposed above the readout electronics 54, 56, 70; and
5. The design and arrangement of the readout electronics 54, 56, 70:
a.) is symmetrical for channels A and B; and
b.) causes a low diode capacity due to a short connection between the readout diodes 50, 52 and the respective readout electronics 54, 56, 70.

The boundary conditions for the use of such a layout of the pixel array 24 with a chessboard structure are:
1. The area of the photonic mixing elements 44 is equal to the area of the readout electronics 54, 56, 70 $A_{Readout\ electronics} = A_{Opt.\ mixer}$.
2. In order to achieve a high fill factor, the area of the routing must be kept small. This is ensured by pixels with few signals.

Figure 6:
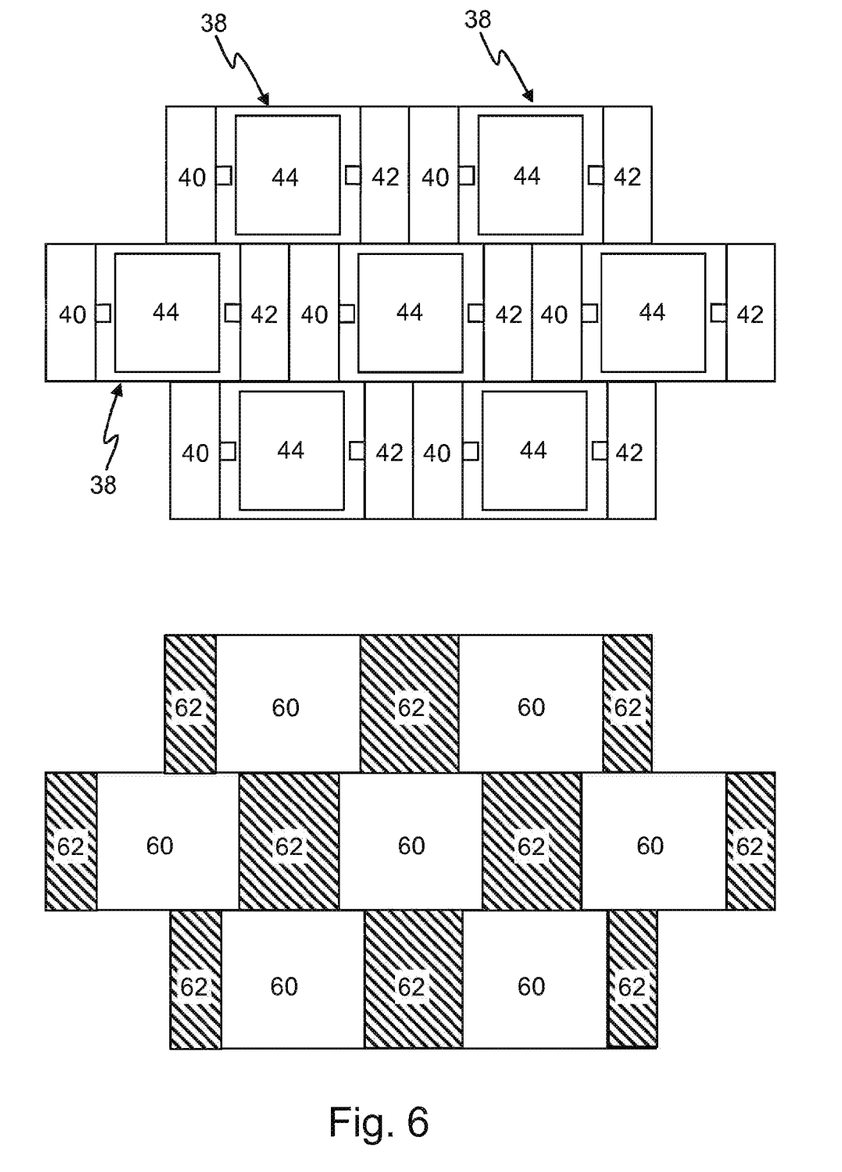
FIG. 6 is a pixel array with an enlarged photosensitive region.

FIG. 6 shows a further embodiment in which the area of the first region 60 or the photoelectric region 38 with its photonic mixing element 44 is designed larger than the area of the second region 62, 40, 42 in which, for example, the readout electronics 54, 56 is arranged. This embodiment, too, can be advantageously arranged in a chessboard structure, wherein fill factors greater than 50% can be realized depending on the design.

Figure 7:
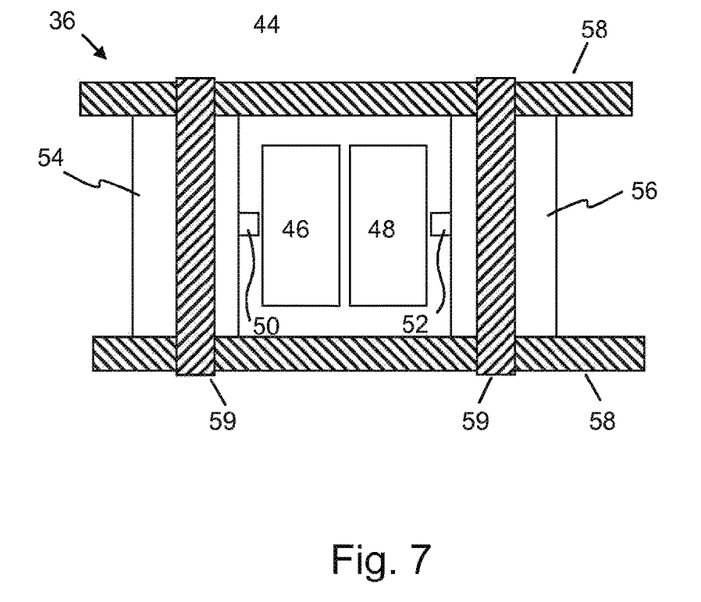
FIG. 7 shows details of a vertical routing.

FIG. 7 shows an embodiment in which the vertical routing 59, preferably in order to save pixel area, is laid in the range of the readout electronics 54, 56. In particular, the metal stack can be build up cone-shaped, so that shadows can be avoided in the case of lateral light incidence.

Figure 8:
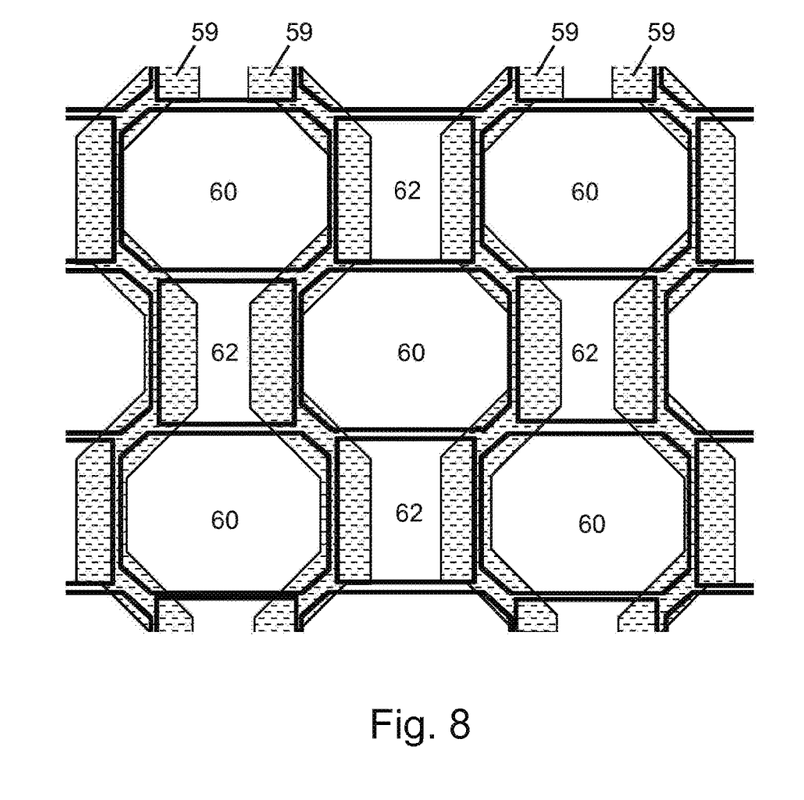
FIG. 8 is a pixel array with meandering routing.

In order to realize the vertical routing 59 especially with a large photoelectric region 38, 60 it is intended to provide the routing, as shown in FIG. 8 even in the corner regions of the photoelectric regions 38 but outside the photonic mixing element 44.

Figure 9:
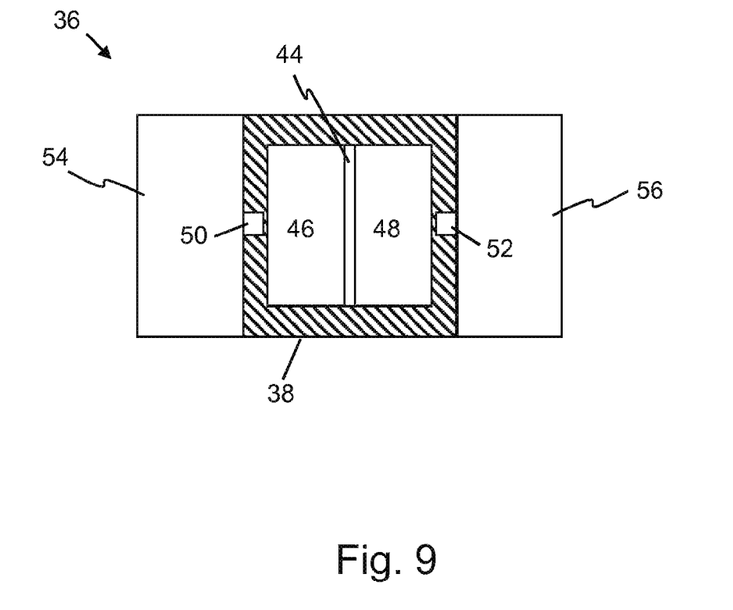
FIG. 9 is a pixel array with a routing in the photosensitive region.

FIG. 9 shows a further embodiment in which the routing also occupies larger areas within the photoelectric region 38 up to the limits of the photonic mixer element 44.

The foregoing description of the embodiments has been provided for purposes of illustration and description. It is not intended to be exhaustive or to limit the disclosure. Individual elements or features of a particular embodiment are generally not limited to that particular embodiment, but, where applicable, are inter-changeable and can be used in a selected embodiment, even if not specifically shown or described. The same may also be varied in many ways. Such variations are to be regarded as a departure from the disclosure, and all such modifications are intended to be included within the scope of the disclosure.

The invention claimed is:

1. A pixel array of a light propagation time sensor for a light propagation time camera, comprising:
a plurality of pixel elements arranged in a matrix array, wherein each individual pixel element comprises a photoelectric region which comprises a photonic mixing element, which is divided into at least one channel with a respective photogate and a respective readout diode and at least one light-insensitive other region, in which a readout electronics is arranged in at least a part thereof, and
a plurality of routing paths which are arranged in a grid-like manner and divide the pixel array into fields; wherein
a group of first fields and a group of second fields are obtained, wherein each of the first fields is provided by a photoelectric region of one of the pixel elements and each of the second fields is provided by the other regions, wherein the first fields and the second fields are arranged alternately in a chessboard structure.

2. The pixel array according to claim 1, wherein in each pixel element the area of the photoelectric region is approximately equal to the total area of the at least one other region.

3. The pixel array according to claim 1, wherein in each pixel element the area of the photoelectric region is greater than the total area of the other region.

4. The pixel array according to claim 1, wherein each of the second fields is provided by at least one other region of a single one of the pixel elements the photoelectric region of which is disposed in an adjacent first field.

5. The pixel array according to claim 1, wherein each of the second fields which is completely surrounded by further fields is provided by at least two other regions of two pixel elements the photoelectric regions of which provide an adjacent first field.

6. The pixel array according to claim 1, wherein the fields are configured square-shaped.

7. The pixel array according to claim 1, wherein the photoelectric region of each pixel element is divided into two subregions, wherein each subregion is adjacent to one of the two other regions of the pixel element which are arranged opposite to each other.

8. A camera, in particular light propagation time camera, for a light propagation time camera system, wherein a light propagation time sensor comprising a pixel array according to claim 1.

9. A light propagation time camera system comprising an illumination module for emitting modulated light and a light propagation time camera for receiving modulated light, wherein the light propagation time camera is configured according to claim 8.

* * * * *